United States Patent [19]
Fujimoto

[11] Patent Number: 6,097,209
[45] Date of Patent: Aug. 1, 2000

[54] ERRONEOUS OPERATION PROTECTION CIRCUIT FORMED BETWEEN DATA BUSES AND INTERGRATED CIRCUIT EMPLOYING THE SAME

[75] Inventor: Yukihiro Fujimoto, Tokyo, Japan

[73] Assignee: Kabushiki Kaisha Toshiba, Kawasaki, Japan

[21] Appl. No.: 08/992,543

[22] Filed: Dec. 17, 1997

[30] Foreign Application Priority Data

Dec. 17, 1996 [JP] Japan ..................................... 8-337156

[51] Int. Cl.$^7$ ................................................. H03K 17/16
[52] U.S. Cl. .................................. 326/27; 326/21; 326/30
[58] Field of Search ................................. 326/21, 27, 30, 326/86, 82, 90; 327/309, 318, 319, 327, 328; 333/32, 12.4

[56] References Cited

U.S. PATENT DOCUMENTS

| 4,985,644 | 1/1991 | Okihara et al. | 326/27 |
| 5,592,104 | 1/1997 | Bach | 326/27 |

*Primary Examiner*—Jon Santamauro
*Assistant Examiner*—Don Phu Le
*Attorney, Agent, or Firm*—Foley & Lardner

[57] ABSTRACT

Erroneous operation protection circuits (EOPs) are provided between a plurality of precharge type data bus wirings which are set to predetermined potential beforehand and to which a plurality of circuit blocks are connected to transfer signals. Accordingly, an increase in stray capacitance of the data bus wirings can be suppressed to the lowest minimum to thus prevent erroneous operation due to coupling noises between the data bus wirings. The EOP comprises a coupling noise detector (CND) for detecting whether or not data transition on a first data bus wiring is caused by coupling noises due to capacitance between the first data bus wiring and a second data bus wiring being aligned in close vicinity to the first data bus wiring, and a precharge device for shifting potential of the first data bus wiring to return to predetermined potential if the coupling noise detector has detected the coupling noises. The EOP may also be applied to discharge type data bus wirings if a polarity and a conductivity type of semiconductor device constituting the EOP are properly reversed.

18 Claims, 10 Drawing Sheets

ERRONEOUS OPERATION PROTECTION CIRCUIT FORMED BETWEEN DATA BUSES AND INTERGRATED CIRCUIT EMPLOYING THE SAME

BACKGROUND OF THE INVENTION

1. Field of the Invention

The present invention relates an erroneous operation protection circuit for preventing an erroneous operation due to coupling noises in a large scale integrated circuit (LSI) in which data bus wirings are aligned in close vicinity to each other on a semiconductor chip, and a large scale integrated circuit (LSI) into which the erroneous operation protection circuits are incorporated.

2. Description of the Prior Art

In recent years, according to the progress of fine pattern technology and the request for improvement in system performance, the large scale integrated circuit (LSI) is manufactured on a larger scale and is operated at a higher speed. FIG. 1 shows an example of a microprocessor in which a plurality of circuit blocks 101, 191 are aligned on a semiconductor chip (LSI chip) 100. As shown in FIG. 1, a data bus wiring 110 to which the circuit blocks 101, 191 are connected is disposed between a plurality of sender (transmitter) side circuit blocks 101 and a receiver side circuit block (or the next stage circuit block) 191. This kind of the data bus wiring 110 is provided to correspond to a bit width which is processed simultaneously by the LSI chip 100 and provided in parallel at as narrow pitches as possible to reduce a wiring area. A wiring length of the data bus wiring 110 becomes long since the data bus wiring 110 extends over a plurality of circuit blocks 101, 191 on LSI chip.

Conversely, in order to improve the device packing density on a single LSI chip, wiring widths and wiring intervals of the metal wirings in the LSI chip are reduced year after year. However, a certain lower limit value is set to thicknesses of the metal wirings because the wiring resistance must be maintained small. In other words, the thicknesses of the metal wirings cannot be reduced below the lower limit value and therefore only an interval between both metal wirings is reduced while mutually opposing areas are kept at a certain value. Thus, there is a tendency to increase capacitance between mutually neighboring data bus wirings. Therefore, a rate of capacitance (wiring capacitance) between adjacent data bus wirings to a total wiring capacitance of the LSI is increased. In this manner, the capacitance between the two adjacent data bus wirings in the LSI corresponding to adjacent bits is extremely high and therefore influence of the coupling (coupling noises) between data on the concerned adjacent bits becomes large when the potential level of one of the adjacent bits is swinged.

In the prior art, as a system driving the data bus wirings, there has been known "a CMOS system" in which the potential level of respective wirings are swinged between a power supply level ("H" level) and a ground level ("L" level) with the use of circuits made of n-MOSFETs and p-MOSFETs being connected in series between the power supply and the ground. As another system driving the data bus wirings, "a precharge type system" in which respective wirings are set to the power supply level beforehand and then the n-MOSFETs arranged in the circuit block are turned ON only when the signal propagates the data bus at the ground level is also known. The precharge type system has such excellent features rather than the CMOS system that (1) no Miller effect is caused, and (2) direction of data transition is constant and thus optimization for the transition direction can be implemented in circuit design.

FIG. 2 is a circuit diagram showing an example of the precharge type system, or a configuration of precharge type data bus wirings, which are generally used as the data bus wirings in the prior art. In FIG. 2, data bus wirings 110n−1, 110n, 110n+1 to which a plurality of circuit blocks 101 are connected have a function of propagating output data from the circuit blocks 101 to input buffers 111 of the circuit block 191 respectively. In respective circuit blocks 101, n-MOSFETs 102 for driving the data bus wirings 110n−1, 110n, 110n+1 into an "L" level are provided. Precharge circuits 112 for setting respective data bus wirings into an "H" level beforehand and latch circuits 113 for holding the data when the data bus wiring is at the "H" level are connected to the data bus wirings 110n−1, 110n, 110n+1.

In turn, an operation of the circuit shown in FIG. 2 will be explained. The data bus wirings 110n−1, 110n, 110n+1 are set to the "H" level by the precharge circuits 112 in advance. When one of the plurality of circuit blocks 101 transfer the data via the data bus wirings 110n−1, 110n, 110n+1, respective precharge circuits 112 are turned OFF. When the circuit block outputs the "L" level, the circuit block 101 for transferring the data renders the n-MOSFET 102 to turn ON and thus drive the corresponding data bus wiring into the "L" level. On the contrary, when one of the circuit blocks 101 outputs data at the "H" level, the latch circuit 113 continues to hold the "H" level of the corresponding data bus wiring while the corresponding n-MOSFET 102 in the circuit blocks 101 is kept in its OFF state. Thereby, the concerned data bus wiring can propagate the "H" level. As a consequence, the input buffers 111 of the circuit block 191 positioned on the preceding stage can receive desired data $OUT_{n-1}$, $OUT_n$, $OUT_{n+1}$.

However, if the integration density of the LSI is improved, as described above, capacitances 114 between the two adjacent wirings are increased in the circuit shown in FIG. 2 and thus capacitances between the two adjacent wirings are increased rather than the capacitance between the data bus wirings 110n−1, 110n, 110n+1 and the ground level. In this case, even if the LSI circuit is designed such that one of the data bus wirings is driven into the "L" level and the adjoining data bus wiring is held at the "H" level by the latch circuit 113, the adjoining data bus wiring to be held at the "H" level is shifted into the "L" level due to influence of the coupling therebetween. As a result, data at the "L" level is transferred to the gate in the circuit block 191 to cause the erroneous operation.

As the countermeasure for such disadvantage, there is a method wherein transition to the "L" level can be prevented by increasing a driving force of the latch circuit 113 rather than the force generated by the influence of the coupling between two adjacent data bus wirings. However, in this case, when the circuit block 101 outputs the "L" level onto the data bus wirings, the latch circuits 113 drive the data bus wirings strongly into the "H" level. As a result, there is such a disadvantage that collision of data happens and the delay of data is caused.

As a method of preventing erroneous operation by avoiding such collision of data, as shown in FIG. 3, a method has been proposed wherein the data bus wirings 110n−1, 10n, 10n+1 are driven by tri-state buffers 103 in respective circuit blocks 101. The tri-state buffers 103 can drive respective data bus wirings 110n−1, 10n, 10n+1 into the "L" level, the "H" level, or its floating state. In the example shown in FIG. 3, when the data bus wirings 110n−1, 10n, 10n+1 are precharged or when the circuit blocks are inactivated, the tri-state buffers 103 are brought into their non-output state not to drive the data bus wirings 110n−1, 10n, 10n+1. Only when the circuit blocks are activated to output the data, the tri-state buffers 103 can drive the data bus wirings into the "L" level or the "H" level according to the data.

As in the above circuit example shown in FIG. 2, respective data bus wirings 110n−1, 10n, 110n+1 are set to the "H" level in advance and data on the data bus wirings are shifted only when the data is at the "L" level, nevertheless the data bus wirings to be held at the "H" level are driven into the "H" level by the tri-state buffers 103 in the circuit blocks 101 which are activated. Hence, even if data transition is caused due to the coupling between the adjacent data bus wirings, the tri-state buffers 103 drive strongly the data bus wiring to the "H" level. Therefore, transition of data to the "L" level can be suppressed and also erroneous operation can be prevented.

However, in the circuit shown in FIG. 3, the tri-state buffers, each having a driving force larger than the force generated by the influence of the coupling, must be provided according to the number of the circuit blocks. This is because such tri-state buffers must be arranged in or near respective circuit blocks since the tri-state buffers need the output signals of respective circuit blocks. In the event that the tri-state buffers are connected to the data bus wirings according to the number of the circuit blocks, the number of transistors constituting the tri-state buffers is of course increased. Therefore, junction capacitances of the transistors are increased as a whole and total parasitic capacitances of the data bus wirings are increased. As a consequence, stray capacitance of the data bus wirings are increased so that wiring delay is increased. In addition, in case the length of the data bus wirings are extremely prolonged to the extent that special variation in the signal level is caused due to the wiring delay on the same data bus wiring, it is difficult to suppress the coupling noises at only one location on the data bus wiring.

Like the above, in the prior art, there has been a problem that a large number of tri-state buffers must be prepared to suppress the coupling noises and thus stray capacitances of the data bus wirings are significantly increased to increase the wiring delay.

SUMMARY OF THE INVENTION

The present invention has been made to overcome the above problems in the prior art, and it is an object of the present invention to provide an erroneous operation protection circuit for preventing an erroneous operation due to coupling noises between adjacent data bus wirings aligned in an LSI by suppressing the increase of stray capacitances of the data bus wirings to the lowest minimum.

It is another object of the present invention to provide an erroneous operation protection circuit which can be disposed at any location along the data bus wiring.

It is still another object of the present invention to provide a semiconductor integrated circuit into which erroneous operation protection circuits are incorporated.

It is yet still another object of the present invention to provide a semiconductor integrated circuit capable of preventing effectively an erroneous operation due to coupling noises between data bus wirings even if the length of the data bus wirings are extremely extended to the extent that special variations in signal level are caused due to wiring delay on the same data bus wiring.

In order to achieve the above objects, a first aspect of the present invention pertaining to the precharge type system resides in that there is provided an erroneous operation protection circuit to be formed between a first data bus wiring and a second data bus wiring, comprising a coupling noise detecting means connected between the first data bus wiring and the second data bus wiring and a precharge means. The coupling noise detecting means that whether or not data transition on the first data bus wiring is caused by coupling noises due to capacitance between the first data bus wiring and the second data bus wiring. The precharge means pulls the potential of the first data bus wiring up to predetermined high potential ("H" level) if the coupling noise detecting means has detected the coupling noises.

According to the first aspect of the present invention, when data transition is caused on the first data bus wiring, the coupling noise detecting means detects whether or not such data transition on the first data bus wiring is caused due to the coupling noises. As the cases where the data transition is caused on the first data bus wiring, there are two cases:

(a) one case is the data transition on the first bus is caused due to the coupling noises generated by data transition on the second data bus wiring; and (b) the other case is the data transition is caused by the driving force of the circuit block being connected to the first data bus wiring.

The coupling noise detecting means can detect whether or not such data transition on the first data bus wiring is caused due to the coupling noises. If the coupling noise detecting means have detected the coupling noises on the first data bus wiring, the precharge means pulls the first data bus wiring up to the predetermined high potential. Accordingly, erroneous operation of the first data bus wiring due to the coupling noises can be prevented. Since the output signals of respective circuit blocks are not needed to drive the erroneous operation protection circuit, the erroneous operation protection circuit of the present invention can be aligned at any locations on the data bus wirings. In other words, even when any circuit block is activated, all erroneous operation protection circuits which are connected to the data bus wirings can be operated. Hence, there is no necessity to provide the erroneous operation protection circuits of the present invention according to the number of the circuit blocks and therefore the number of transistors to be connected to the data bus wirings can be reduced rather than the prior art.

In the first aspect of the present invention, it is preferable that the coupling noise detecting means detects a difference of potential between the first data bus wiring and the second data bus wiring to thus detect the coupling noises. This is because difference of potential between the data bus wirings can be detected by one or two transistors and therefore the coupling noise detecting means with a simple configuration can be operated.

More particularly, the coupling noise detecting means is made up of an n-MOSFET whose gate terminal is connected to the first data bus wiring, whose source terminal is connected to the second data bus wiring, and whose drain terminal is used as an output terminal. And the precharge means is made up of a p-MOSFET whose gate terminal is connected to an output terminal of the coupling noise detecting means, whose source terminal is connected to a power supply for supplying the predetermined high potential, and whose drain terminal is connected to the first data bus wiring. Therefore, the coupling noise detecting means with a simple configuration can be operated firmly.

Otherwise, in the first aspect of the present invention, it is preferable that the coupling noise detecting means is made up of a first p-MOSFET and an n-MOSFET which are connected in series. A source terminal of the n-MOSFET is connected to the second data bus wiring. A source terminal of the first p-MOSFET is connected to a power supply for supplying the predetermined high potential. The potential of the first data bus wiring is supplied to respective gate terminals of the first p-MOSFET and the n-MOSFET, and a connection point between respective drain terminals serving as an output terminal of the coupling noise detecting means. And the precharge means is made up of a second p-MOSFET whose gate terminal is connected to an output terminal of the coupling noise detecting means, whose source terminal is connected to a power supply for supplying the predetermined high potential, and whose drain terminal is connected to the first data bus wiring. Therefore, if both the first data bus wiring and the second data bus wiring are driven into the "L" level, the first p-MOSFET of the coupling noise detecting means is turned ON and also the "H" level signal is input forcibly into the gate terminal of the second p-MOSFET serving as the precharge means. Consequently, the gate terminal of the second p-MOSFET can be prevented from being brought into the high impedance state. That is to say, variation in potential of the gate terminal of the second p-MOSFET caused by the leakage current flowing into the gate terminal of the second p-MOSFET through the coupling noise detecting means can be prevented. On the contrary, if the gate terminal of the second p-MOSFET is at its floating state, a malfunction would be induced by the leakage current through the coupling noise detecting means. In this case, it is preferable that potential of the first data bus wiring is supplied to the gate terminal of the first p-MOSFET via a delay element, and the potential of the first data bus wiring is directly supplied to the gate terminal of the n-MOSFET. Therefore, when the first data bus wiring starts to change from the "H" level to the "L" level due to the coupling noises, the first p-MOSFET is not turned ON by the delay element so that the coupling noise detecting operation of the n-MOSFET is never prevented.

A second aspect of the present invention pertains to "a discharge type system". Namely, the second aspect resides in that there is provided an erroneous operation protection circuit to be formed between a first data bus wiring and a second data bus wiring, comprising a coupling noise detecting means connected between the first data bus wiring and the second data bus wiring and a discharge means. The coupling noise detecting means detects whether or not data transition on the first data bus wiring is caused by coupling noises due to capacitances between the first data bus wiring and the second data bus wiring. And the discharge means pulls potential of the first data bus wiring down to ground potential or predetermined low potential ("L" level) if the coupling noise detecting means has detected the coupling noises.

According to the second aspect of the present invention, in the discharge type data bus wirings, the same operation as that of the precharge type data bus wirings explained in the above first aspect can be executed.

In the second aspect of the present invention, it is preferable that the coupling noise detecting means detects a difference of potential between the first data bus wiring and the second data bus wiring to thus detect the coupling noises. Also, in the discharge type data bus wirings, the difference of potential between the data bus wirings can be detected by one or two transistors and therefore the coupling noise detecting means with a simple configuration can be formed.

In the second aspect of the present invention, the coupling noise detecting means is made up of a p-MOSFET whose gate terminal is connected to the first data bus wiring, whose source terminal is connected to the second data bus wiring, and whose drain terminal is used as an output terminal of the coupling noise detecting means. And the discharge means is made up of an n-MOSFET whose gate terminal is connected to an output terminal of the coupling noise detecting means, whose source terminal is connected to the ground potential or predetermined low potential, and whose drain terminal is connected to the first data bus wiring. Therefore, the coupling noise detecting means with a simple configuration can be operated firmly.

Furthermore, in the second aspect of the present invention, it is preferable that the coupling noise detecting means is made up of a first n-MOSFET and a p-MOSFET which are connected in series. A source terminal of the p-MOSFET is connected to the second data bus wiring, a source terminal of the first n-MOSFET is connected to the ground potential or predetermined low potential. And the potential of the first data bus wiring is supplied to respective gate terminals of the first n-MOSFET and the p-MOSFET, and a connection point between respective drain terminals serving as the output terminal of the coupling noise detecting means. The discharge means is made up of a second n-MOSFET whose gate terminal is connected to the output terminal of the coupling noise detecting means, whose source terminal is connected to the ground potential or predetermined low potential, and whose drain terminal is connected to the first data bus wiring. Therefore, in the discharge type data bus wirings, if both the first data bus wiring and the second data bus wiring are driven into the "H" level, the first n-MOSFET of the coupling noise detecting means is turned ON and also the "L" level signal is input forcibly into the gate terminal of the second n-MOSFET serving as the precharge means. Hence, variation in potential of the gate terminal of the second n-MOSFET caused by the leakage current flowing into the gate terminal of the second n-MOSFET to thus cause a malfunction can be prevented. If the first n-MOSFET should not be present, the gate terminal of the second n-MOSFET may become at its floating state, and the leakage current flowing into the gate terminal will turn ON the second n-MOSFET. In this case, it is preferable that potential of the first data bus wiring is supplied to the gate terminal of the first n-MOSFET via a delay element, and the potential of the first data bus wiring is directly supplied to the gate terminal of the p-MOSFET. Therefore, when the first data bus wiring starts to change from the "L" level to the "H" level due to the coupling noises, the first n-MOSFET is not turned ON by the delay element so that the coupling noise detecting operation of the p-MOSFET is in no way prevented.

A third aspect of the present invention pertains to a semiconductor integrated circuit having a plurality of circuit blocks and a plurality of precharge type data bus wirings connected to respective circuit blocks for transferring the signals. In the third aspect of the present invention, the plurality of erroneous operation protection circuits explained in the first aspect of the present invention are connected to the plurality of precharge type data bus wirings with a predetermined spacing.

According to the third aspect of the present invention, the semiconductor integrated circuit can be provided wherein special uniformity of potential level on the data bus wirings can be improved and thus erroneous operation can be prevented with a good efficiency even when the length of data bus wirings are prolonged to the extent that special variation in the signal level on the same data bus wirings is caused due to wiring delay.

A fourth aspect of the present invention is concerned with a semiconductor integrated circuit having a plurality of circuit blocks and a plurality of discharge type data bus wirings connected to respective circuit blocks for transferring the signals. In other words, the plurality of erroneous operation protection circuits explained in the second aspect of the present invention are connected to the plurality of discharge type data bus wirings with a predetermined spacing.

According to the fourth aspect of the present invention, special uniformity of potential level on these data bus wirings can be maintained and thus erroneous operation of these data bus wirings can be prevented with a good efficiency even when lengths of the data bus wirings in the semiconductor integrated circuit are expanded longer to the extent that special variation in the signal level on the same data bus wirings is caused due to wiring delay.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
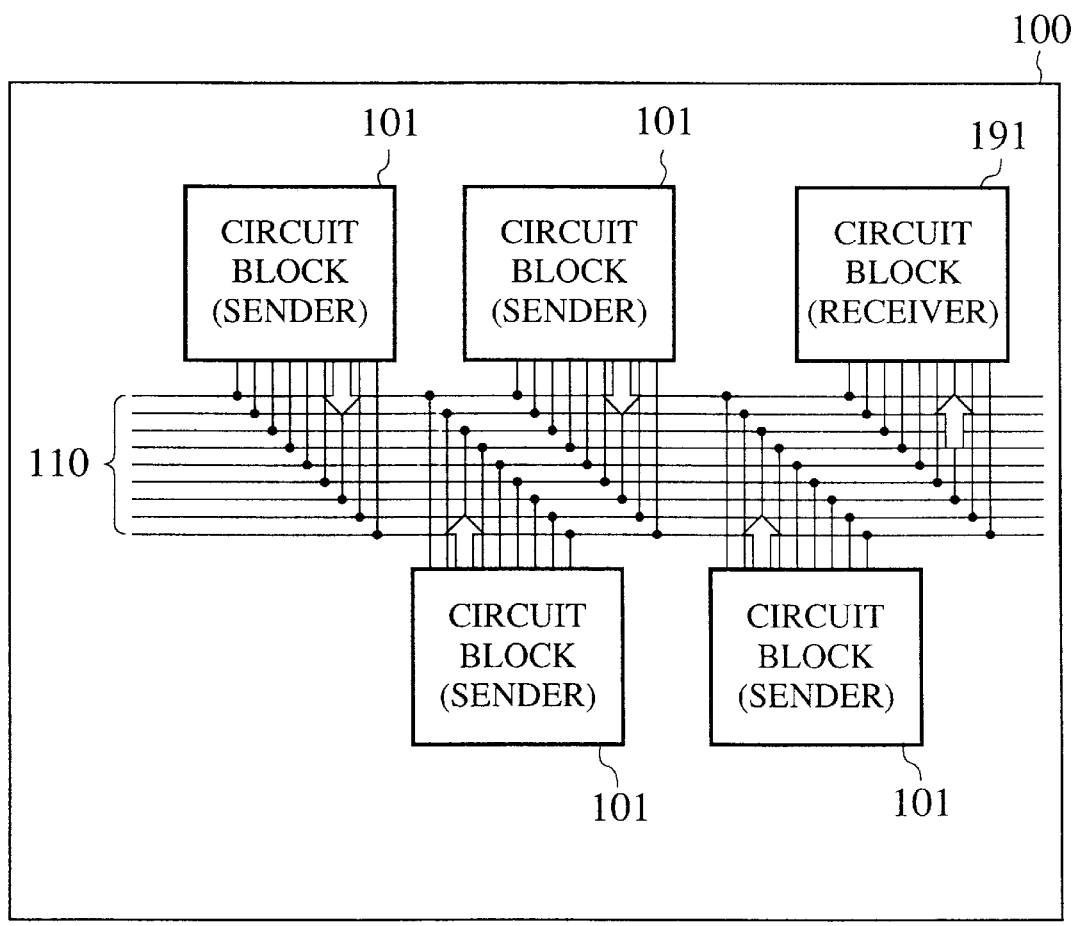
FIG. 1 is a view showing a data bus wiring of a semiconductor integrated circuit in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

Figure 4:
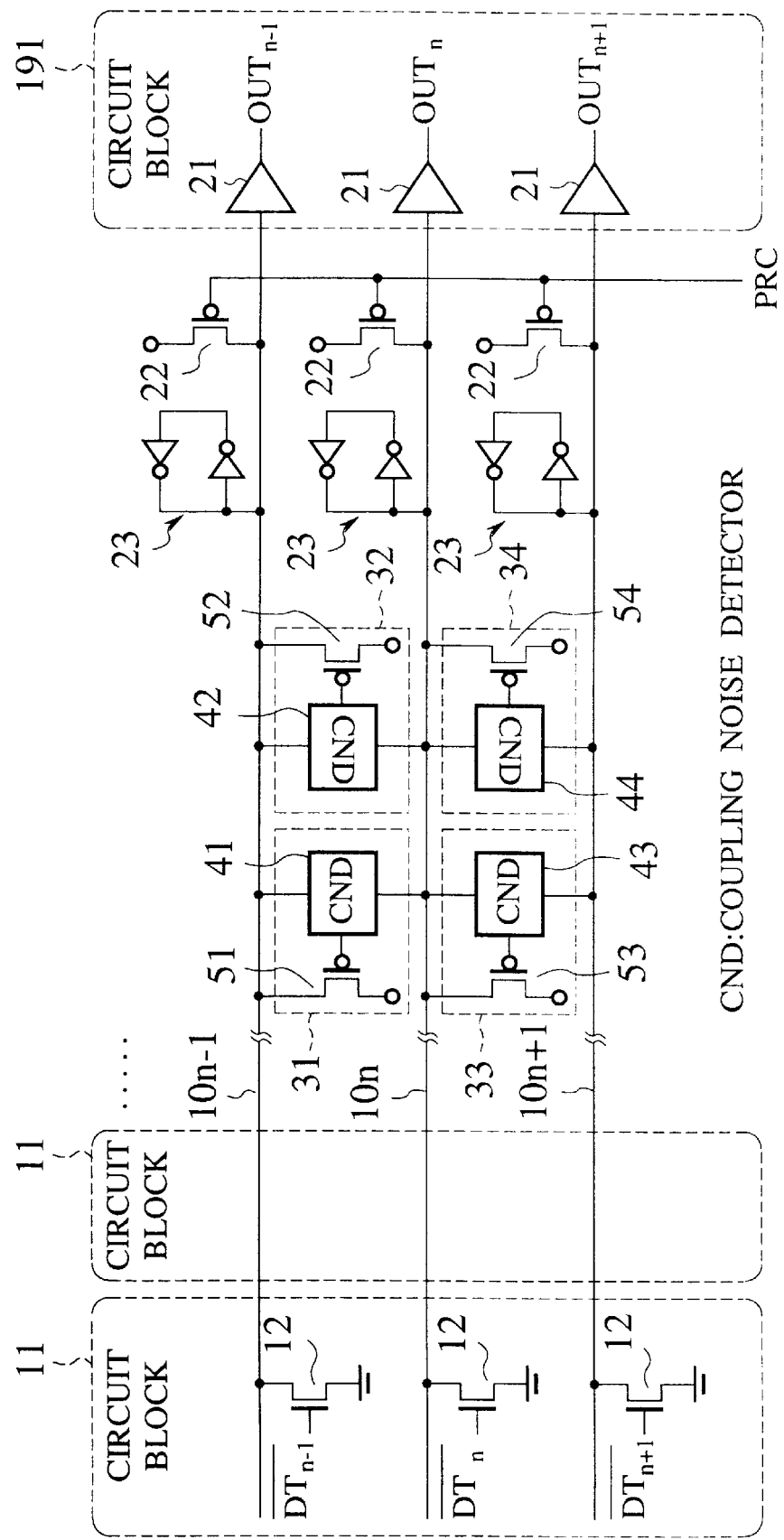
FIG. 4 is a block circuit diagram showing a part of data bus wirings having erroneous operation protection circuits with coupling noise detectors (CNDs) according to a first embodiment of the present invention.

FIG. 4 is a block circuit diagram showing precharge type data bus wirings to which erroneous operation protection circuits (EOPs) according to a first embodiment of the present invention are applied. The precharge type data bus wirings according to the first embodiment of the present invention are provided in an LSI like a microprocessor, for example, having a plurality of circuit blocks in numbers according to a bit width which is processed simultaneously by the LSI. In FIG. 4, for simplicity of explanation, there will be made an explanation for the case where three data bus wirings are illustrated.

Like the conventional circuit shown in FIG. 1, data bus wirings $10n-1$, $10n$, $10n+1$ to which a plurality of sender side circuit blocks 11 provided in an LSI are connected have functions for propagating output data from these circuit blocks 11 to input buffers 21 of the receiver side circuit blocks 191 respectively. In respective circuit blocks 11, n-MOSFETs 12 are provided to drive the data bus wirings $10n-1$, $10n$, $10n+1$ into an "L" level. In other words, in respective n-MOSFETs 12, the drain terminals are connected to the data bus wirings $10n-1$, $10n$, $10n+1$, the source terminals are connected to ground, and output data $\overline{DT}_{n-1}$, $\overline{DT}_n$, $\overline{DT}_{n+1}$ of the circuit blocks 11 are supplied to the gate terminals.

In addition to the plurality of circuit blocks 11, to respective data bus wirings $10n-1$, $10n$, $10n+1$ are connected precharge circuits 22 which set beforehand the data bus wirings $10n-1$, $10n$, $10n+1$ to an "H" level potential according to a precharge signal PRC. Latch circuits 23 which hold data on the data bus wirings $10n-1$, $10n$, $10n+1$ are connected to the data bus wirings $10n-1$, $10n$, $10n+1$, respectively. In addition, EOPs 31, 32, 33, 34 according to the first embodiment of the present invention, which can prevent erroneous operations of the data bus wirings due to coupling noises, are connected between two adjacent data bus wirings out of the data bus wirings $10n-1$, $10n$, $10n+1$.

The EOPs 31 to 34 are made up of coupling noise detectors (CNDs) 41 to 44 connected between neighboring data bus wirings, and precharge means 51 to 54 connected to the data bus wirings, respectively. The CNDs 41 to 44 detect respectively whether or not data transition on one data bus wiring is caused by the coupling noises being generated by data transition on the other data bus wiring or by drive of the n-MOSFET 12 in the circuit block 11 being connected to such one data bus wiring. As described above, the coupling noises are generated due to capacitance between neighboring data bus wirings. The precharge means 51 to 54 have a function for pulling the data bus wiring, which has been subjected to the coupling noises, up to the "H" level potential, which is identical to initialization potential, respectively if the CNDs 41 to 44 have detected that data transition on one data bus wiring is caused by data transition on the other data bus wiring.

Figure 5:
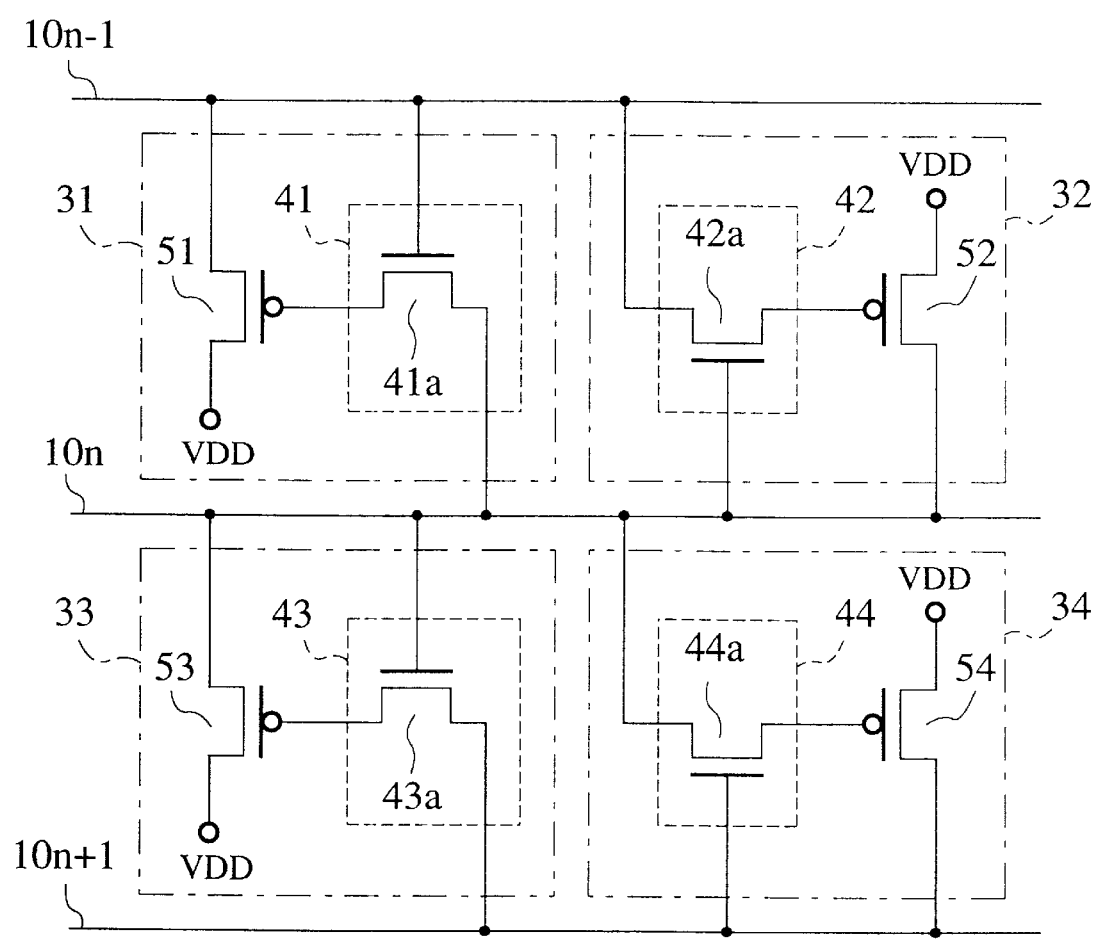
FIG. 5 is a circuit diagram illustrating concrete configurations of the erroneous operation protection circuits according to the first embodiment of the present invention.

FIG. 5 is a circuit diagram illustrating concrete configurations of the EOPs 31 to 34 according to the first embodiment of the present invention. As shown in FIG. 5, the EOPs 31, 32 are provided between the data bus wirings $10n-1$ and $10n$, and the EOPs 33, 34 are also provided between the data bus wirings $10n$ and $10n+1$. The EOPs 31, 32, 33, 34 are formed to have the same configuration. However, in connection with the data bus wirings $10n-1$ and $10n$, the EOP 31 assumes the data bus wiring $10n-1$ as the data bus wiring which receives the influence of the coupling noise, while the EOP 32 assumes the data bus wiring $10n$ as the data bus wiring which receives the influence of the coupling noise.

Similarly, in connection with the data bus wirings 10*n* and 10*n*+1, the EOP 33 assumes the data bus wiring 10*n* as the coupling noise receiving data bus, while the EOP 34 assumes the data bus wiring 10*n*+1 as the coupling noise receiving data bus. Under such assumptions, connection relationships between the EOPs 31 to 34 and the data bus wirings 10*n*–1, 10*n*, 10*n*+1 are constructed.

More particularly, as shown in FIG. 5, the EOP 31 consists of a CND 41 made up of an n-MOSFET 41*a*, and a precharge means 51 made up of a p-MOSFET. A gate terminal and a source terminal of the n-MOSFET 41*a* serving as the CND 41 are connected to the data bus wiring 10*n*–1 and the data bus wiring 10*n* respectively, and a drain terminal thereof serving as an output of the CND 41 is connected to the precharge means 51. In the p-MOSFET serving as the precharge means 51, a gate terminal is connected to the drain terminal of the n-MOSFET 41*a*, a source terminal is connected to the power supply VDD for supplying a high level ("H" level) power supply voltage, and a drain terminal is connected to the data bus wiring 10*n*–1.

The EOP 32 is connected to the data bus wirings 10*n*–1, 10*n* in an opposite direction to the EOP 31. The EOP 32 consists of a CND 42 made up of an n-MOSFET 42*a*, and a precharge means 52 made up of a p-MOSFET. A gate terminal and a source terminal of the n-MOSFET 42*a* serving as the CND 42 are connected to the data bus wiring 10*n* and the data bus wiring 10*n*–1 respectively, and a drain terminal thereof serving as an output of the CND 42 is connected to the precharge means 52. In the p-MOSFET serving as the precharge means 52, a gate terminal is connected to the drain terminal of the n-MOSFET 41*a*, a source terminal is connected to the power supply VDD for supplying the high level ("H" level) power supply voltage, and a drain terminal is connected to the data bus wiring 10*n*.

The EOP 33 consists of a CND 43 made up of an n-MOSFET 43*a*, and a precharge means 53 made up of a p-MOSFET. The EOP 33 is connected to the data bus wirings 10*n* and 10*n*+1 in the same manner as in the EOP 31.

The EOP 34 is connected to the data bus wirings 10*n*, 10*n*+1 in an opposite direction to the EOP 33. The EOP 34 consists of a CND 44 made up of an n-MOSFET 44*a*, and a precharge means 54 made up of a p-MOSFET. The EOP 34 is connected to the data bus wirings 10*n* and 10*n*+1 in the same manner as in the EOP 32.

Figure 2:
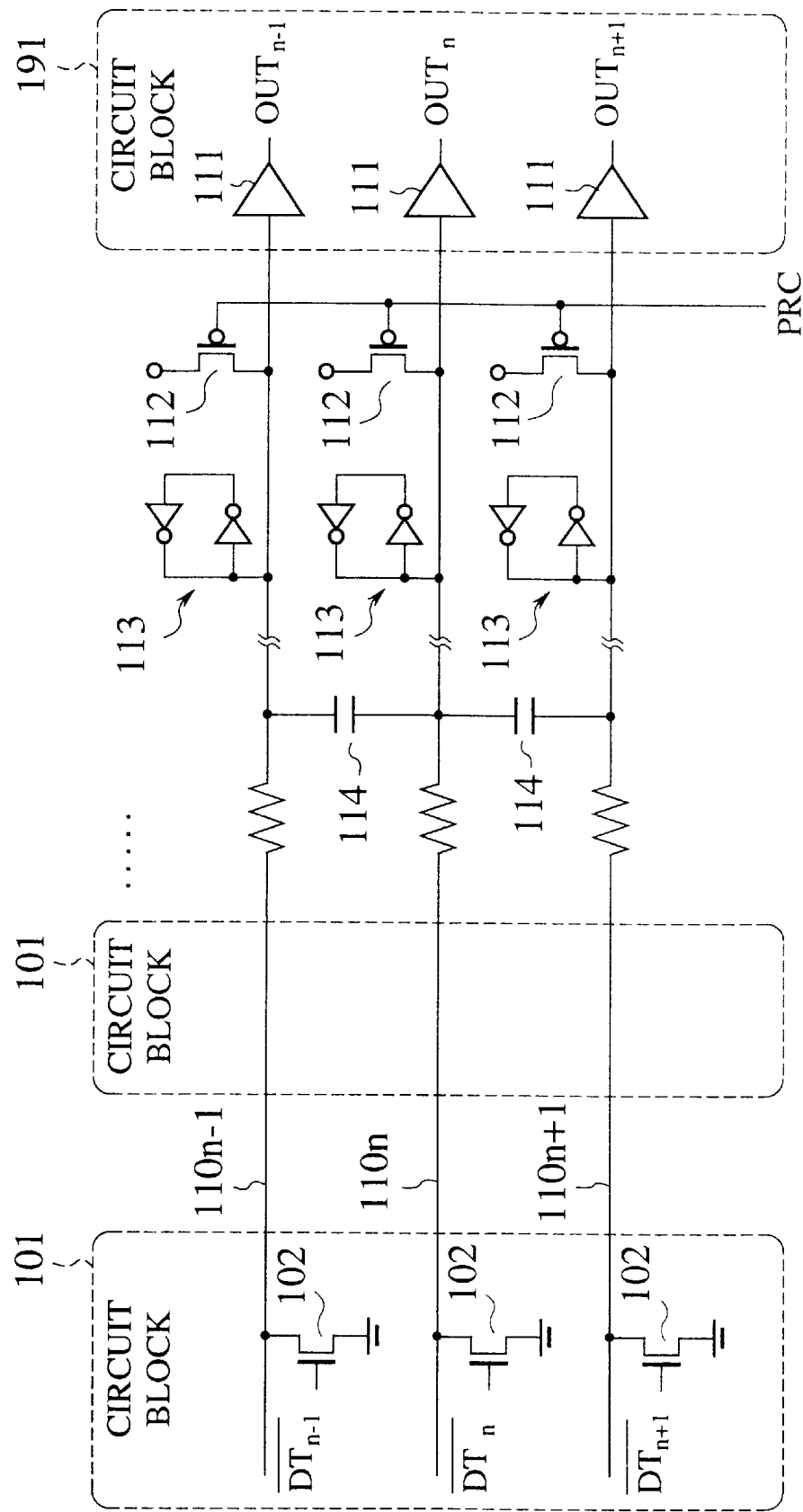
FIG. 2 is a circuit diagram showing an example of a configuration of a precharge type system, or the precharge type data bus wirings in the prior art.

Next, an operation of the first embodiment of the present invention will be explained hereunder. Initially, the data bus wirings 10*n*–1, 10*n*, 10*n*+1 according to the first embodiment of the present invention are set to the "H" level potential by respective precharge circuits 22. And then, if the circuit block 11 is activated to output data onto the data bus wirings 10*n*–1, 10*n*, 10*n*+1, the data bus wirings 10*n*–1, 10*n*, 10*n*+1 can then propagate data according to whether or not the data bus wirings are driven by the n-MOSFETs 12 in the circuit block 11, like the prior art shown in FIG. 2. More particularly, if the circuit block 11 propagates the "H" level, the data bus wirings hold the "H" level by use of the latch circuits 23 to remain in their initial states. If the circuit block 11 propagates the "L" level, the n-MOSFETs 12 in the circuit block 11 are turned ON to thus drive the data bus wirings into the "L" level.

Figure 6A:
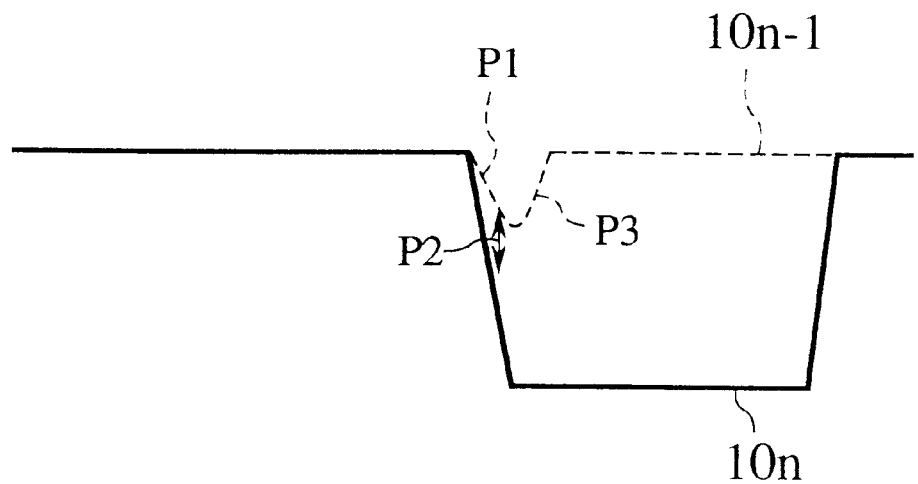
FIGS. 6A and 6B are waveform charts showing potential levels of the data bus wirings having erroneous operation protection circuits according to the first embodiment of the present invention respectively.
Figure 6B:
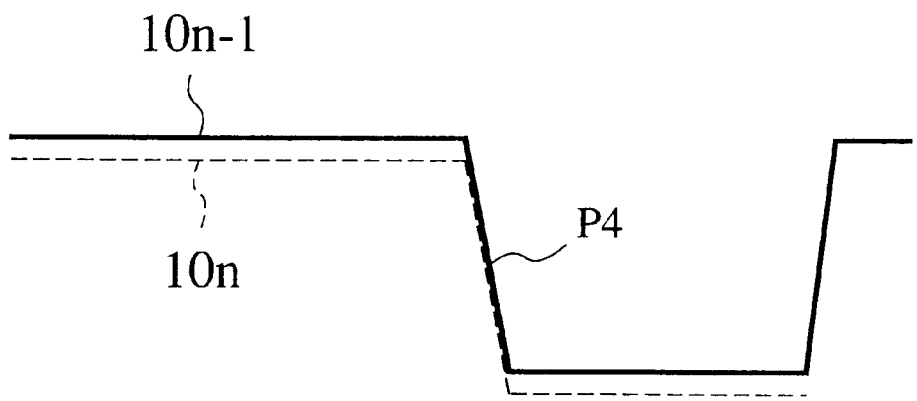

The transient response of the potential levels on the precharge type data bus wirings according to the first embodiment of the present invention will be explained hereunder. FIGS. 6A and 6B are waveform charts showing potential levels of the data bus wirings having EOPs according to the first embodiment of the present invention respectively. In other words, FIG. 6A is a waveform chart showing a potential level when one of neighboring data bus wirings is set to the "H" level and the other of the neighboring data bus wirings is set to the "L" level. FIG. 6B is a waveform chart showing a potential level when both two adjacent data bus wirings are set to the "L" level.

For instance, assume that only the data bus wiring 10*n* is driven into the ground level ("L" level) by the circuit block 11 which is activated, after both the data bus wirings 10*n*–1, 10*n* are set in advance to the power supply VDD level ("H" level). In this case, as shown by P1 in FIG. 6A, when the data bus wiring 10*n*–1 is driven towards the "L" level slightly by the coupling noises generated between the data bus wiring 10*n* and this data bus wiring 10*n*–1, potential difference is generated between the gate-source of the n-MOSFET 41*a* constituting the CND 41 (the gate potential of the n-MOSFET 41*a* is made higher than the source potential), as shown by P2 in FIG. 6A, to turn ON the n-MOSFET 41*a* since data transition time on the data bus wiring 10*n*–1 is slow rather than data transition time on the data bus wiring 10*n*. Accordingly, the CND 41 outputs potential level of the data bus wiring 10*n*. This potential is input into the gate of the p-MOSFET 51 serving as the precharge means to turn ON the p-MOSFET 51. More particularly, as shown by P3 in FIG. 6A, the p-MOSFET 51 pulls the data bus wiring 10*n*–1 up towards the "H" level while the potential of the data bus wiring 10*n* is drived from the "H" level to the "L" level. Consequently, transition of the data bus wiring 10*n*–1 from the "H" level to the "L" level due to the coupling noises with the data bus wiring 10*n* can be prevented. As shown in FIG. 6A, potential of the data bus wiring 10*n*–1 is slightly reduced temporarily, but it is possible that, by adjusting the gate threshold value of the input buffer 21 of the receiver side circuit block (or the next stage circuit block) 191 to which the data bus wiring 10*n*–1 is connected, this temporary potential change has no effect on the receiver side circuit block 191.

If both the data bus wirings 10*n*–1 and 10*n* propagate the "L" level signal, as shown by P4 in FIG. 6B, no potential difference occurs between the data bus wirings 10*n*–1, 10*n* since the activated circuit block 11 simultaneously drive both the data bus wirings 10*n*–1, 10*n* into the "L" level. Accordingly, the n-MOSFET 41*a* of the CND 41 is not turned ON and thus potential of the data bus wiring 10*n* is not transferred to the gate of the p-MOSFET 51 serving as the precharge means. As a result, the data bus wiring 10*n*–1 is not driven into the "H" level by the precharge means 51, and therefore the EOP 31 of the present invention in no way disturbs that the data bus wiring 10*n*–1, 10*n* are driven into the "L" level by the circuit block 11.

In the first embodiment, erroneous operation of the data bus wiring 10*n*–1 due to the coupling noises can be prevented upon driving the data bus wirings 10*n*–1 and 10*n* since the EOP 31 operates as stated above.

Conversely, if only the data bus wiring 10*n*–1 is driven into the "L" level by the circuit block 11 which is activated after both the data bus wirings 10*n*–1, 10*n* are set to the power supply VDD level ("H" level) previously, the EOP 32 which is arranged in opposite direction to the EOP 31 is operated. More particularly, the similar operation to that being executed by the CND 41 and the precharge means 51 in the EOP 31 can be executed by the n-MOSFET 42*a* constituting the CND 42 and the p-MOSFET serving as the precharge means 52. As a consequence, upon driving the data bus wirings 10*n*–1 and 10*n*, the erroneous operation of the data bus wiring 10*n* due to the coupling noises can be prevented.

In addition, the EOP 33 or the EOP 34 operate to drive the data bus wirings 10n and 10n+1 so as to carry out the same operations as those of the EOPs 31 and 32. As a consequence, in connection with the data bus wirings 10n and 10n+1, erroneous operations of the data bus wirings 10n and 10n+1 due to the coupling noises can be prevented.

Figure 3:
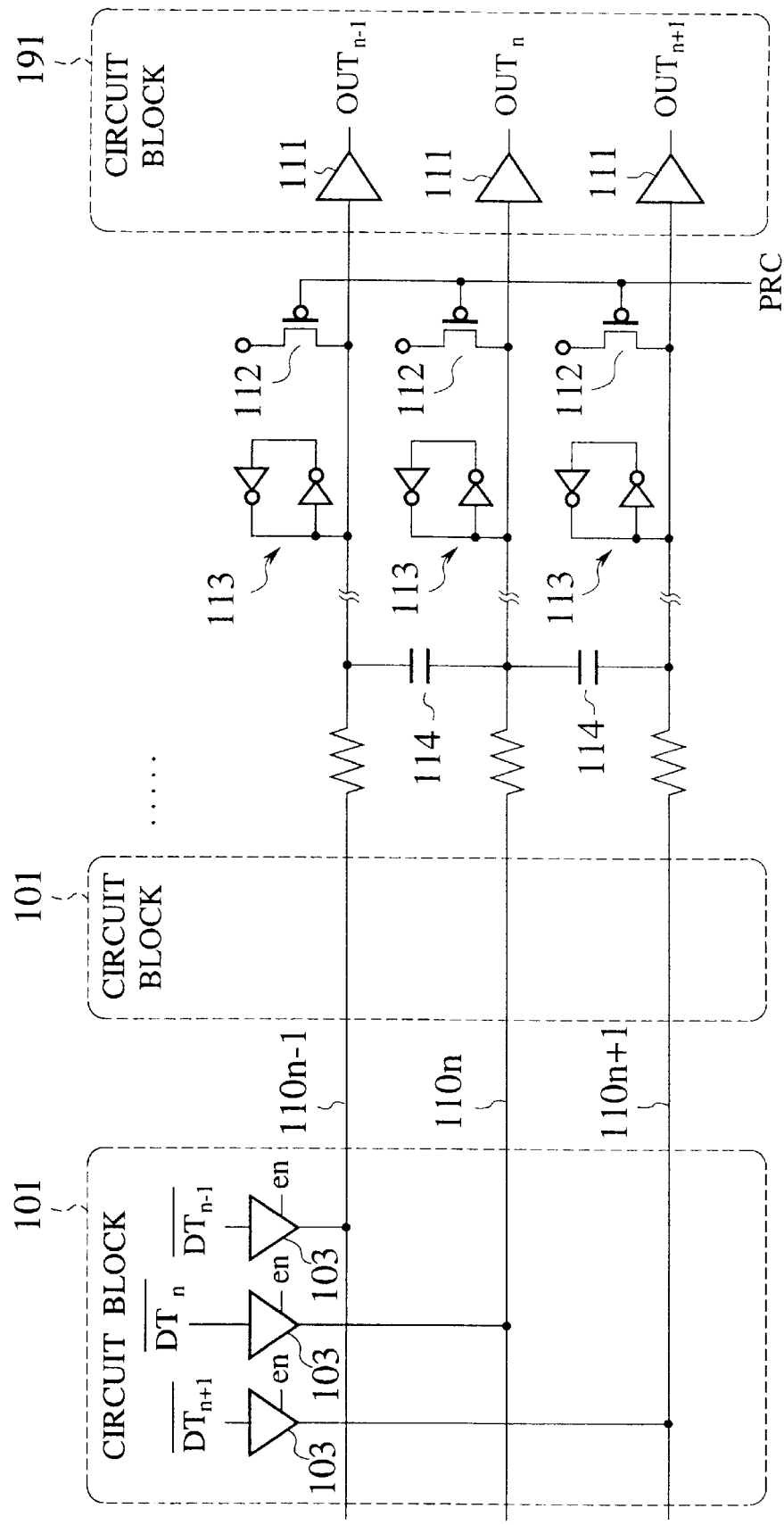
FIG. 3 is a circuit diagram showing an example of another configuration of the precharge type data bus wirings in the prior art.

Moreover, the above EOPs 31 to 34 can be aligned at any locations on the data bus wirings since the output signals of respective circuit blocks 11 are not required for an operation to prevent erroneous operations in the above EOPs 31 to 34. Since all EOPs being connected to the data bus wirings can be operated even when any circuit block 11 is activated, there is no necessity of providing the EOPs according to the present invention corresponding to the number of the plurality of circuit blocks 11. Accordingly, the number of transistors to be connected to the data bus wirings can be drastically reduced rather than the conventional configuration shown in FIG. 3. As a result, the stray capacitance on the data bus wiring, or wiring load capacitance can be reduced and wiring delay can be minimized to the lowest value.

SECOND EMBODIMENT

Figure 7:
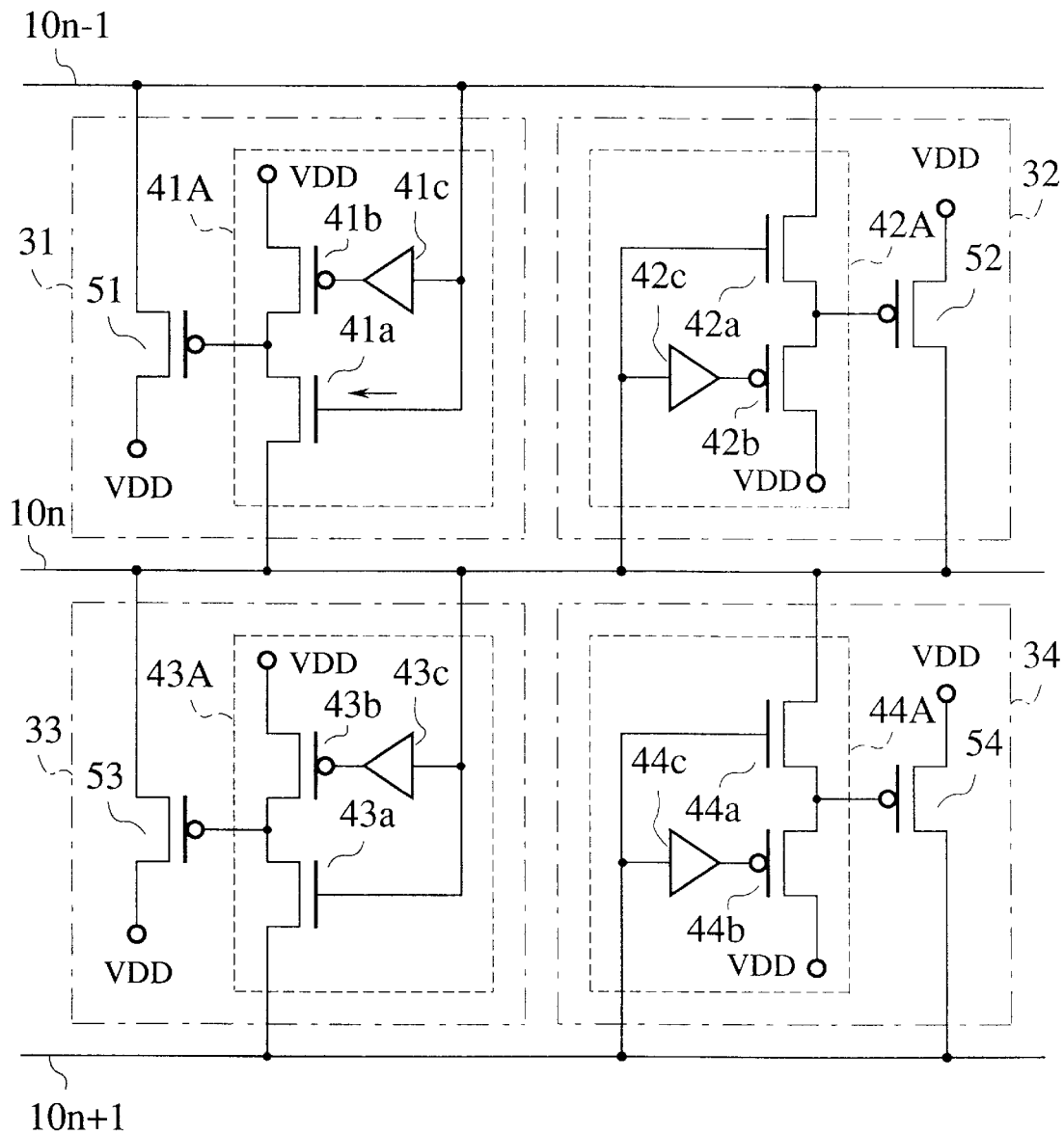
FIG. 7 is a circuit diagram showing configurations of erroneous operation protection circuits according to a second embodiment of the present invention.

Next, a second embodiment of the present invention will be explained hereunder. FIG. 7 is a circuit diagram showing erroneous operation protection circuits (EOPs) according to the second embodiment of the present invention. In FIG. 7, common elements to those in FIG. 4 are denoted by the same references. In the second embodiment of the present invention, the coupling noise detectors (CNDs) 41 to 44 in the EOPs 31 to 34 are replaced with CNDs 41A, 42A, 43A, 44A having different configurations in the first embodiment of the present invention shown in FIG. 4.

More particularly, in the CNDs 41A to 44A according to the second embodiment of the present invention, first p-MOSFETs 41b, 42b, 43b, 44b and delay elements 41c, 42c, 43c, 44c are provided in addition to the n-MOSFETs 41a to 44a provided in the first embodiment. The first p-MOSFETs 41b to 44b are connected between the power supply VDD for the high level ("H" level) power supply voltage and the drain terminals of the n-MOSFETs 41a to 44a. Signals which are obtained by delaying the signals on the data bus wirings 10n−1, 10n, 10n+1 by use of the delay elements 41c to 44c are input into the gate terminals of the first p-MOSFETs 41b to 44b.

In the second embodiment of the present invention, when two adjacent data bus wirings, e.g., both the data bus wiring 10n−1 and the data bus wiring 10n−1 are driven into the "L" level by the circuit blocks being activated, the CNDs 41A, 42A operate to prevent the gate terminals of the p-MOSFETs 51, 52 from being plunged into high impedance states. More specifically, when both the data bus wirings 10n−1, 10n are shifted into the "L" level, the p-MOSFETs 41b, 42b are turned ON and then the signal at the "H" level is input forcibly into the gate terminals of the precharge means 51, 52. Accordingly, the precharge means 51, 52 for precharging the data bus wirings 10n−1, 10n respectively are not turned ON and also malfunctions caused by the high-impedance state (i.e., floating state) of the gate terminals of the precharge means 51, 52 can be prevented. If the CNDs 41A, 42A should lack the first p-MOSFETs 41b, 42b, the gate terminals of the second p-MOSFETs 51, 52 plunge into their floating states, and the leakage currents (electrons) of the CNDs are flown into the gate terminals of the second p-MOSFETs 51, 52 being in their floating states, the potentials of the gate terminals of the second p-MOSFETs are gradually lowered to thus make the malfunction (unintentional turn-ON of the second p-MOSFETs 51, 52). In addition, when potential of the data bus wiring 10n−1 or 10n is started to change from the "H" level to the "L" level due to the coupling noises, the p-MOSFETs 41b, 42b are not turned ON since the delay elements 41c, 42c are provided, so that the p-MOSFETs 41b, 42b never disturb the coupling noise detecting operation of the n-MOSFETs 41a, 42a.

It is needless to say that the EOPs 33, 34 can be operated similarly by the CNDs 43A, 44A even if both the data bus wiring 10n and the data bus wiring 10n+1 are driven into the "L" level.

THIRD EMBODIMENT

Next, a third embodiment of the present invention will be explained hereunder. Although "precharge type" data bus wirings, in which respective wirings are set to the power supply level ("H" level) in advance and then the concerned wiring is driven into the ground level by the circuit block only when respective wirings propagate the ground level ("L" level) signal, have been employed as the wiring driving systems in the first and second embodiments, so-called "discharge type" data bus wirings opposite to above "precharge type" are employed in this third embodiment. In other words, the third embodiment will prevent the erroneous operation due to the coupling noises between the two adjacent data bus wirings in the discharge type data bus wirings in which respective wirings are set to the ground level ("L" level) beforehand and then the concerned wiring is driven into the power supply level by the circuit block only when respective wirings propagate the power supply level ("H" level) signal.

Figure 8:
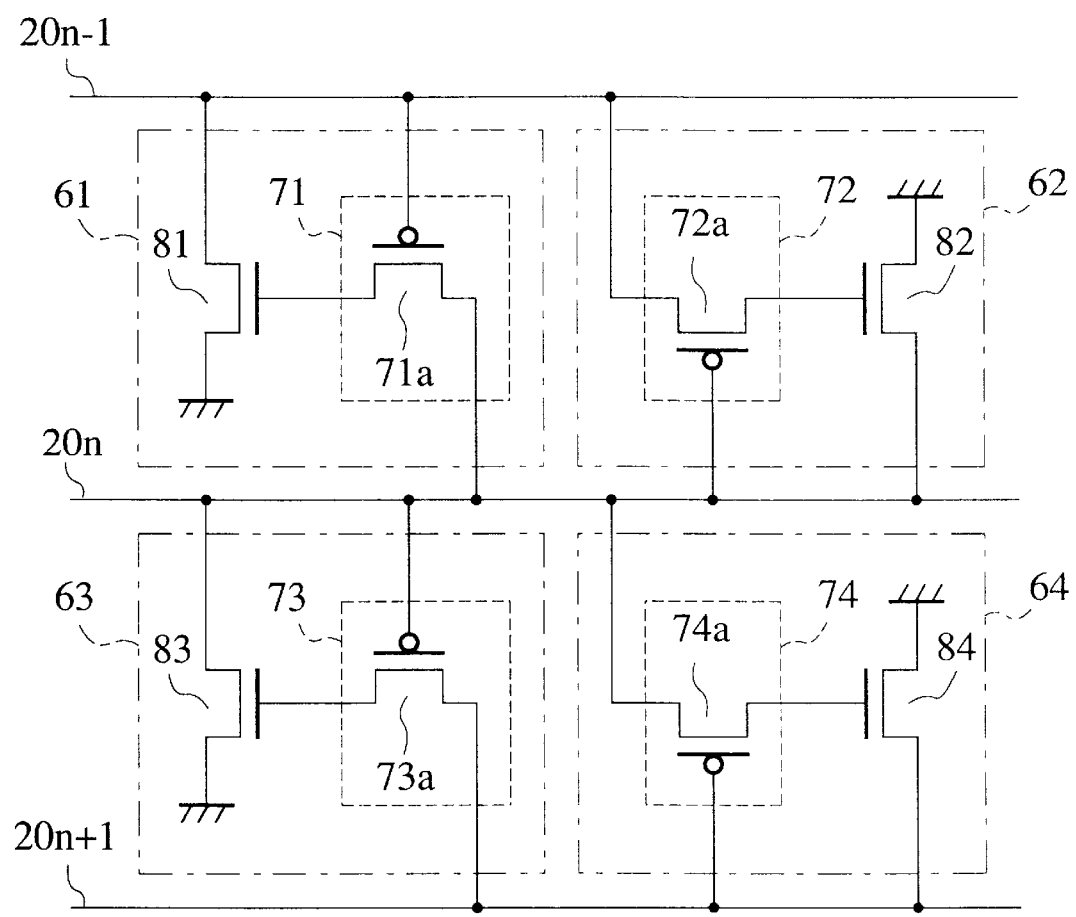
FIG. 8 is a circuit diagram showing configurations of erroneous operation protection circuits according to a third embodiment of the present invention.

FIG. 8 is a circuit diagram showing configurations of erroneous operation protection circuits (EOPs) according to a third embodiment of the present invention. These EOPs are formed to have opposite polarity to those of the EOPs in the above first embodiment shown in FIG. 5. More particularly, the EOP 61 connected between the discharge type data bus wirings 20n−1 and 20n consists of a coupling noise detector (CND) 71 made up of a p-MOSFET 71a, and a discharge means made up of an n-MOSFET 81. A gate terminal and a source terminal of the p-MOSFET 71a are connected to the data bus wiring 20n−1 and the data bus wiring 20n respectively, and a drain terminal of the p-MOSFET 71a is an output of the CND 71. A gate terminal of the n-MOSFET 81 is connected to the output of the CND 71, and a source terminal and a drain terminal of the n-MOSFET 81 are connected to the ground level and the data bus wiring 20n−1 respectively.

Similarly, the EOP 62 consists of a CND 72 made up of a p-MOSFET 72a, and a discharge means made up of an n-MOSFET 82. The EOP 62 is connected between the data bus wirings 20n−1 and 20n to be arranged in an opposite direction to the EOP 61.

In addition, the EOP 63 consists of a CND 73 made up of a p-MOSFET 73a, and a discharge means made up of an n-MOSFET 83. The EOP 62 is connected between the data bus wirings 20n and 20n+1 to be directed in the same direction as the EOP 61. Also, the EOP 64 consists of a CND 74 made up of a p-MOSFET 74a, and a discharge means made up of an n-MOSFET 84. The EOP 64 is connected between the data bus wirings 20n and 20n+1 to be disposed in the opposite direction to the EOP 63.

An operation of the EOPs of the third embodiment of the present invention will be given as the operation achieved when the precharge type data bus wirings 10n−1, 10n, 10n+1 are replaced with the discharge type data bus wirings 20n–1, 20n, 20n+1 respectively and the conductivity type of the MOSFETs as well as the polarities of the signals are reversed in the first embodiment. In the third embodiment, the discharge means 81 to 84 pull the potential of the data bus wiring 20n–1, 20n, 20n+1 down to ground potential or predetermined low potential ("L" level). In this manner, the same advantages as those of the first embodiment can be achieved by applying the EOPs according to the third embodiment of the present invention to the discharge type data bus wiring drive system.

FOURTH EMBODIMENT

Figure 9:
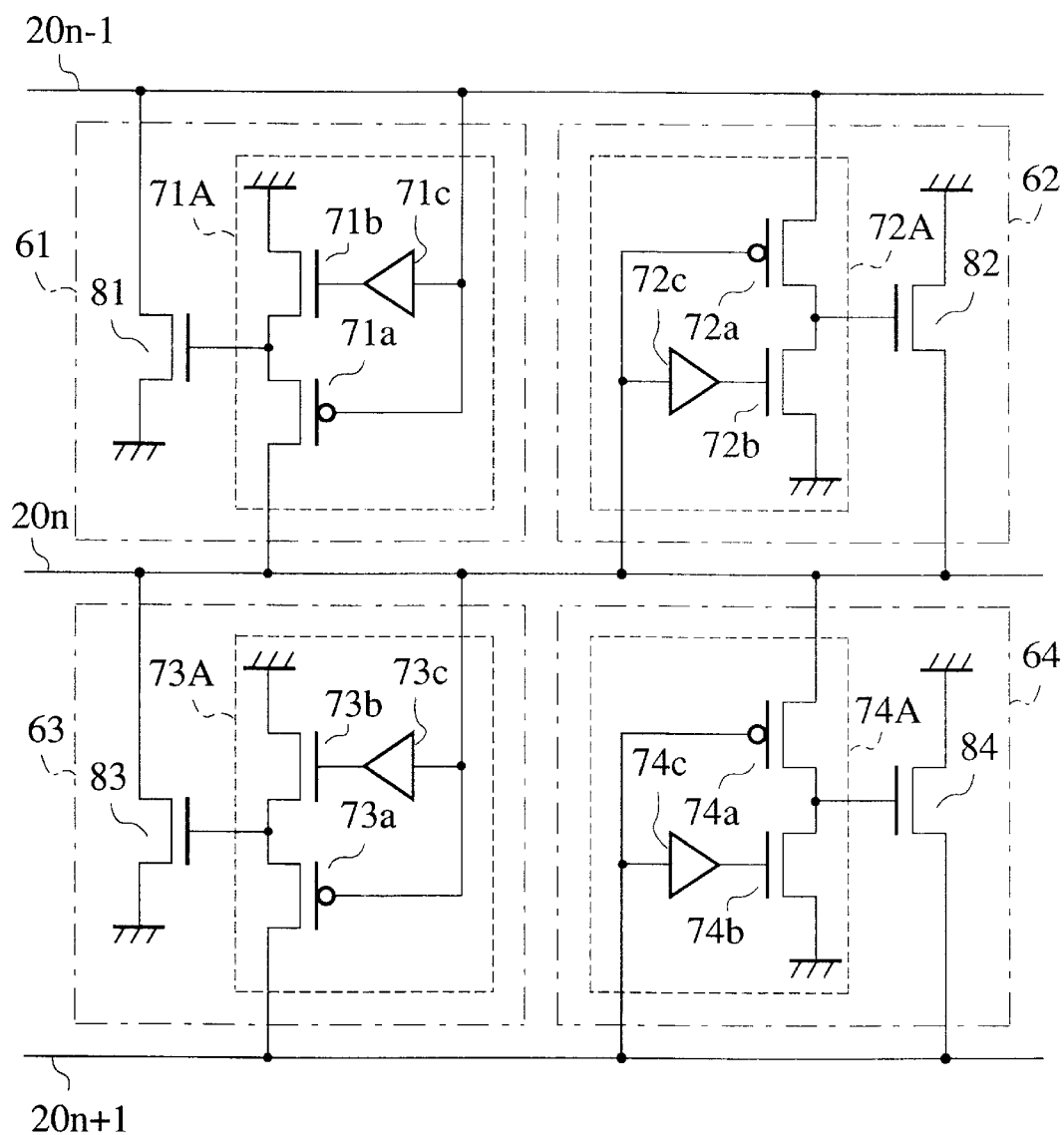
FIG. 9 is a circuit diagram showing configurations of erroneous operation protection circuits according to a fourth embodiment of the present invention.

Next, a fourth embodiment of the present invention will be explained. In the fourth embodiment, erroneous operation protection circuits (EOPs) corresponding to the above second embodiment are applied to the discharge type data bus wirings. In other words, FIG. 9 is a circuit diagram showing EOPs according to the fourth embodiment of the present invention and, in FIG. 9, like references refer to like elements in FIG. 8. The fourth embodiment of the present invention can be considered as that the coupling noise detectors (CNDs) 71 to 74 in the EOPs 61 to 64 are replaced with CNDs 71A, 72A, 73A, 74A formed to have a different configuration respectively in the third embodiment shown in FIG. 8.

The fourth embodiment of the present invention will be explained in detail hereinbelow. In the CNDs 71A to 74A according to the fourth embodiment of the present invention, first n-MOSFETs 71b, 72b, 73b, 74b and delay elements 71c, 72c, 73c, 74c are provided in addition to the p-MOSFETs 71a to 74a in the third embodiment. The first n-MOSFETs 71b to 74b are connected between the ground potential ("L" level) and the drain terminals of the p-MOSFETs 71a to 74a respectively. Signals which are obtained by delaying the signals on the data bus wirings 20n–1, 20n, 20n+1 by use of the delay elements 71c to 74c are input into the gate terminals of the first n-MOSFETs 71b to 74b.

An operation of the EOP according to the fourth embodiment of the present invention corresponds to the operation of the second embodiment accomplished when the precharge type data bus wirings 10n–1, 10n, 101n+1 are replaced with the discharge type data bus wirings 20n–1, 20n, 20n+1 and polarity of the signals are reversed. In accordance with output signals from EOPs 71A to 74A, the discharge means 81 to 84 pull the potential of the data bus wiring down to the ground potential ("L" level). In this manner, if the EOPs according to the fourth embodiment of the present invention are applied to the discharge type wiring drive system, such an advantage can be achieved that gradual increase in potential of the gate terminals of the second n-MOSFETs to cause malfunction (unintential turn ON of the second n-MOSFETs 81 to 84) can be prevented, like the above second embodiment, even when leakage currents (holes) of the CNDs flow into the gate terminals of the second n-MOSFETs in the floating state.

FIFTH EMBODIMENT

Figure 10:
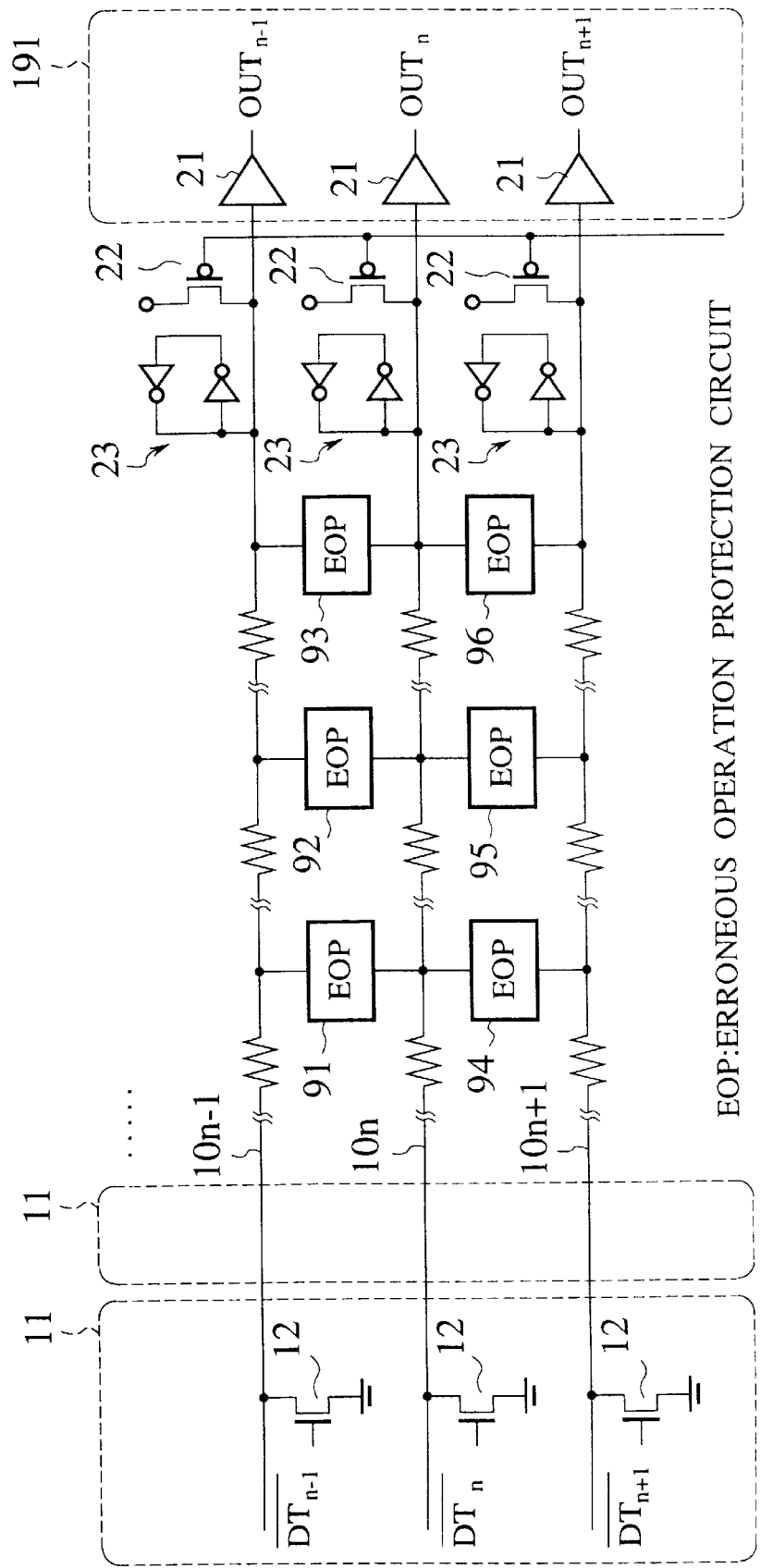
FIG. 10 is a block circuit diagram showing a pertinent portion of a semiconductor integrated circuit having a plurality of erroneous operation protection circuits (EOPs) on each data bus wiring, according to a fifth embodiment of the present invention.

Next, a fifth embodiment of the present invention will be explained. In this fifth embodiment, an example is shown wherein a plurality of erroneous operation protection circuits (EOPs) of the present invention are disposed between the data bus wirings at an appropriately divided distance if the length of respective data bus wirings are extremely prolonged to the extent that special variation of the signal level on the same data bus wirings becomes significant. FIG. 10 is a block circuit diagram showing a pertinent portion of a semiconductor integrated circuit according to the fifth embodiment of the present invention. In FIG. 10, like references refer to like elements in FIG. 4 and their explanation will be omitted. As shown in FIG. 10, a plurality of EOPs 91, 92, 93 are connected between the extremely long data bus wiring 10n–1 and the extremely long data bus wiring 10n with a predetermined spacing. Each EOP 91, 92, 93 incorporates respectively a pair of EOPs 31, 32 shown in FIG. 5, for example. Similarly, EOPs 94, 95, 96 are connected between the extremely long data bus wirings 10n, 10n+1 with the predetermined spacing. Each EOPs 94, 95, 96 incorporates respectively a pair of EOPs 33, 34 shown in FIG. 5, for example.

As stated in the preceding embodiments, the present invention can suppress the increase of extra stray capacitance of the data bus wirings to the lowest minimum, and the wiring delay time on these data bus wirings is essentially small. However, even with the effectiveness of the present invention, when the length of respective data bus wirings 10n–1, 10n, 10n+1 are extremely prolonged as shown in FIG. 10, wiring resistance is increased correspondingly so that special variation in the signal level may appear on the same data bus wiring. Since the data bus wirings themselves act as a kind of delay circuit, polarity (or phase angle) of the signals may be reversed at two mutually remote points on the same data bus wirings as the case may be. Various signal level differences between two adjacent data bus wirings may be sometimes caused at locations mutually remoted from a certain distance on the LSI chip. And there is a possibility that different levels of coupling noises may be caused at different locations. In the fifth embodiment of the present invention, if respective EOPs 91 to 96 are positioned at the locations to cancel the special variation of the signal level due to the wiring resistance when the EOPs 91 to 96 are driven, mutual relationship between the data bus wirings 10n–1, 10n, 10n+1 due to the above various coupling noise levels can be made uniform on every locations on the LSI chip so that erroneous operations can be prevented with good efficiency. Since output signals of respective circuit blocks 11 are not needed in the EOP operation, the EOPs 91 to 96 of the fifth embodiment of the present invention can be aligned at any locations on the extremely long data bus wirings 10n–1, 10n, 10n+1. Accordingly, the EOPs 91 to 96 may be aligned on the LSI chip at a desired spacing so as to correspond to respective signal delay times.

Various modifications will become possible for those skilled in the art after receiving the teachings of the present disclosure without departing from the scope thereof.

What is claimed is:

1. An erroneous operation protection circuit to be formed between a first and a second data bus wirings, comprising:
   (a) a coupling noise detecting means connected between the first data bus wiring and the second data bus wiring, for detecting whether or not data transition on the first data bus wiring is caused by coupling noises due to capacitance between the first and the second data bus wirings; and
   (b) a precharge means for pulling potential of the first data bus wiring up to predetermined high potential if the coupling noise detecting means has detected the coupling noises.

2. The erroneous operation protection circuit of claim 1, wherein the coupling noise detecting means detects a difference of potential between the first data and the second data bus wirings to thus detect the coupling noises.

3. The erroneous operation protection circuit of claim 1, wherein the coupling noise detecting means is made up of an n-MOSFET whose gate terminal is connected to the first data bus wiring, whose source terminal is connected to the second data bus wiring, and whose drain terminal is used as an output terminal, and the precharge means is made up of a p-MOSFET whose gate terminal is connected to the output terminal of the coupling noise detecting means, whose source terminal is connected to a power supply for supplying the predetermined high potential, and whose drain terminal is connected to the first data bus wiring.

4. The erroneous operation protection circuit of claim 2, wherein the coupling noise detecting means is made up of an n-MOSFET whose gate terminal is connected to the first data bus wiring, whose source terminal is connected to the second data bus wiring, and whose drain terminal is used as an output terminal, and the precharge means is made up of a p-MOSFET whose gate terminal is connected to the output terminal of the coupling noise detecting means, whose source terminal is connected to a power supply for supplying the predetermined high potential, and whose drain terminal is connected to the first data bus wiring.

5. The erroneous operation protection circuit of claim 1, wherein the coupling noise detecting means is made up of a first p-MOSFET and an n-MOSFET which are connected in series, a source terminal of the n-MOSFET being connected to the second data bus wiring, a source terminal of the first p-MOSFET being connected to a power supply for supplying the predetermined high potential, potential of the first data bus wiring being supplied to respective gate terminals of the first p-MOSFET and the n-MOSFET, and a connection point between respective drain terminals serving as an output terminal, and the precharge means is made up of a second p-MOSFET whose gate terminal is connected to the output terminal of the coupling noise detecting means, whose source terminal is connected to a power supply for supplying the predetermined high potential, and whose drain terminal is connected to the first data bus wiring.

6. The erroneous operation protection circuit of claim 2, wherein the coupling noise detecting means is made up of a first p-MOSFET and an n-MOSFET which are connected in series, a source terminal of the n-MOSFET being connected to the second data bus wiring, a source terminal of the first p-MOSFET being connected to a power supply for supplying the predetermined high potential, potential of the first data bus wiring being supplied to respective gate terminals of the first p-MOSFET and the n-MOSFET, and a connection point between respective drain terminals serving as an output terminal, and the precharge means is made up of a second p-MOSFET whose gate terminal is connected to the output terminal of the coupling noise detecting means, whose source terminal is connected to a power supply for supplying the predetermined high potential, and whose drain terminal is connected to the first data bus wiring.

7. The erroneous operation protection circuit of claim 5, wherein potential of the first data bus wiring is supplied to the gate terminal of the first p-MOSFET via a delay element, and the potential of the first data bus wiring is directly supplied to the gate terminal of the n-MOSFET.

8. The erroneous operation protection circuit of claim 6, wherein potential of the first data bus wiring is supplied to the gate terminal of the first p-MOSFET via a delay element, and the potential of the first data bus wiring is directly supplied to the gate terminal of the n-MOSFET.

9. An erroneous operation protection circuit to be formed between a first and a second data bus wirings, comprising:

(a) a coupling noise detecting means connected between the first data bus wiring and the second data bus wiring, for detecting whether or not data transition on the first data bus wiring is caused by coupling noises due to capacitances between the first and the second data bus wirings; and (b) a discharge means for pulling potential of the first data bus wiring down to ground potential or predetermined low potential if the coupling noise detecting means has detected the coupling noises.

10. The erroneous operation protection circuit of claim 9, wherein the coupling noise detecting means detects a difference of potential between the first and the second data bus wirings to thus detect the coupling noises.

11. The erroneous operation protection circuit of claim 9, wherein the coupling noise detecting means is made up of a p-MOSFET whose gate terminal is connected to the first data bus wiring, whose source terminal is connected to the second data bus wiring, and whose drain terminal is used as an output terminal, and the discharge means is made up of an n-MOSFET whose gate terminal is connected to the output terminal of the coupling noise detecting means, whose source terminal is connected to the ground potential or predetermined low potential, and whose drain terminal is connected to the first data bus wiring.

12. The erroneous operation protection circuit of claim 10, wherein the coupling noise detecting means is made up of a p-MOSFET whose gate terminal is connected to the first data bus wiring, whose source terminal is connected to the second data bus wiring, and whose drain terminal is used as an output terminal, and the discharge means is made up of an n-MOSFET whose gate terminal is connected to the output terminal of the coupling noise detecting means, whose source terminal is connected to the ground potential or predetermined low potential, and whose drain terminal is connected to the first data bus wiring.

13. The erroneous operation protection circuit of claim 9, wherein the coupling noise detecting means is made up of a first n-MOSFET and a p-MOSFET which are connected in series, a source terminal of the p-MOSFET being connected to the second data bus wiring, a source terminal of the first n-MOSFET being connected to the ground potential or predetermined low potential, potential of the first data bus wiring being supplied to respective gate terminals of the first n-MOSFET and the p-MOSFET, and a connection point between respective drain terminals serving as an output terminal, and the discharge means is made up of a second n-MOSFET whose gate terminal is connected to the output terminal of the coupling noise detecting means, whose source terminal is connected to the ground potential or predetermined low potential, and whose drain terminal is connected to the first data bus wiring.

14. The erroneous operation protection circuit of claim 10, wherein the coupling noise detecting means is made up of a first n-MOSFET and a p-MOSFET which are connected in series, a source terminal of the p-MOSFET being connected to the second data bus wiring, a source terminal of the first n-MOSFET being connected to the ground potential or predetermined low potential, potential of the first data bus wiring being supplied to respective gate terminals of the first n-MOSFET and the p-MOSFET, and a connection point between respective drain terminals serving as an output terminal, and the discharge means is made up of a second n-MOSFET whose gate terminal is connected to the output terminal of the coupling noise detecting means, whose source terminal is connected to the ground potential or predetermined low potential, and whose drain terminal is connected to the first data bus wiring.

15. The erroneous operation protection circuit of claim 13, wherein potential of the first data bus wiring is supplied to the gate terminal of the first n-MOSFET via a delay element, and the potential of the first data bus wiring is directly supplied to the gate terminal of the p-MOSFET.

16. The erroneous operation protection circuit of claim 14, wherein potential of the first data bus wiring is supplied to the gate terminal of the first n-MOSFET via a delay element, and the potential of the first data bus wiring is directly supplied to the gate terminal of the p-MOSFET.

17. An integrated circuit having a first and a second data bus wirings and a plurality of erroneous operation protection circuits formed between the first and the second data bus wirings, the erroneous operation protection circuits being disposed with a predetermined spacing therebetween respectively, each of the erroneous operation protection circuits comprising:

(a) a coupling noise detecting means connected between the first and the second data bus wirings, for detecting whether or not data transition on the first data bus wiring is caused by coupling noises due to capacitance between the first and the second data bus wirings; and (b) a precharge means for pulling potential of the first data bus wiring up to predetermined high potential if the coupling noise detecting means has detected the coupling noises.

18. An integrated circuit having a first and a second data bus wirings and a plurality of erroneous operation protection circuits formed between the first and the second data bus wirings, the erroneous operation protection circuits being disposed with a predetermined spacing therebetween respectively, each of the erroneous operation protection circuits comprising:

(a) a coupling noise detecting means connected between the first and the second data bus wirings, for detecting whether or not data transition on the first data bus wiring is caused by coupling noises due to capacitance between the first and the second data bus wirings; and (b) a discharge means for pulling potential of the first data bus wiring down to ground potential or predetermined low potential if the coupling noise detecting means has detected the coupling noises.

* * * * *

UNITED STATES PATENT AND TRADEMARK OFFICE
CERTIFICATE OF CORRECTION

PATENT NO. : 6,097,209
DATED : August 1, 2000
INVENTOR(S) : Yukihiro FUJIMOTO.

It is certified that error appears in the above-identified patent and that said Letters Patent is hereby corrected as shown below:

On the title page, item: [54] Title of Invention, delete "ERRONEOUS OPERATION PROTECTION CIRCUIT FORMED BETWEEN DATA BUSES AND INTERGRATED CIRCUIT EMPLOYING THE SAME" and replace with --ERRONEOUS OPERATION PROTECTION CIRCUIT FORMED BETWEEN DATA BASES AND INTEGRATED CIRCUIT EMPLOYING THE SAME--.

Signed and Sealed this

Twenty-second Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO. : 6,097,209
DATED : August 1, 2000
INVENTOR(S) : Yukihiro Fujimoto

It is certified that error appears in the above-identified patent and that said Letters Patent is hereby corrected as shown below:

Title page,
Item [54], Title, should read -- ERRONEOUS OPERATION PROTECTION CIRCUIT FORMED BETWEEN DATA BASES AND INTEGRATED CIRCUIT EMPLOYING THE SAME --.

Signed and Sealed this

Sixteenth Day of November, 2004

JON W. DUDAS
*Director of the United States Patent and Trademark Office*